United States Patent
Godard

(10) Patent No.: US 8,421,677 B2
(45) Date of Patent: Apr. 16, 2013

(54) TUNEABLE ANTENNA FOR ELECTROMAGNETIC COMPATIBILITY TESTS

(75) Inventor: Mael Godard, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 878 days.

(21) Appl. No.: 12/526,049

(22) PCT Filed: Feb. 12, 2008

(86) PCT No.: PCT/EP2008/051651
§ 371 (c)(1),
(2), (4) Date: Aug. 6, 2009

(87) PCT Pub. No.: WO2008/101834
PCT Pub. Date: Aug. 28, 2008

(65) Prior Publication Data
US 2010/0007562 A1    Jan. 14, 2010

(30) Foreign Application Priority Data
Feb. 14, 2007    (FR) ...................................... 07 53258

(51) Int. Cl.
*G01R 29/10*    (2006.01)
(52) U.S. Cl.
USPC .................................. 343/700 MS; 343/703
(58) Field of Classification Search .......... 343/700 MS, 343/702, 703
See application file for complete search history.

(56) References Cited

U.S. PATENT DOCUMENTS

| | | | | |
|---|---|---|---|---|
| 2,898,562 A | * | 8/1959 | Trevor, Jr. | ...................... 333/259 |
| 3,274,602 A | * | 9/1966 | Randall et al. | ................ 343/762 |
| 3,621,481 A | * | 11/1971 | Perreault et al. | .............. 333/159 |
| 3,806,943 A | | 4/1974 | Holloway | |
| 4,283,727 A | | 8/1981 | Martel et al. | |
| 5,585,808 A | * | 12/1996 | Wysome | ....................... 343/703 |
| 6,690,327 B2 | * | 2/2004 | McKinzie et al. | ..... 343/700 MS |
| 7,310,072 B2 | * | 12/2007 | Ronzani et al. | .................... 345/8 |

FOREIGN PATENT DOCUMENTS

| | | | |
|---|---|---|---|
| EP | 0 003 463 | | 8/1979 |
| FR | 958 781 | | 3/1950 |
| JP | 4269001 A | * | 3/2004 |

\* cited by examiner

*Primary Examiner* — Jacob Y Choi
*Assistant Examiner* — Hasan Islam
(74) *Attorney, Agent, or Firm* — Oblon, Spivak, McClelland, Maier & Neustadt, L.L.P.

(57) ABSTRACT

An antenna for electromagnetic compatibility testing, that includes an upper plate and a lower plate having parallel longitudinal axes, maintained at a distance from each other, and mechanically connected to each other at each of their longitudinal ends by longitudinal plates. The upper and lower plates and longitudinal plates define a space. The upper and lower plates and the longitudinal plates are mounted so as to be capable of movement relative to each other to define a space having dimensions that can be modified, wherein the distance between the lower and upper plates can be modified and/or the length of the lower and upper plates can be modified.

16 Claims, 4 Drawing Sheets

TUNEABLE ANTENNA FOR ELECTROMAGNETIC COMPATIBILITY TESTS

TECHNICAL FIELD AND PRIOR ART

This invention relates to an antenna to perform electromagnetic compatibility (EMC) tests.

Electronic equipment on an aircraft or automobile vehicle interacts electromagnetically with other equipment and with the environment. To a certain extent, it disturbs this environment and in turn has some susceptibility to electromagnetic aggression.

The electromagnetic environment, in which the degree of pollution is variable as a function of the situation, includes all potential electromagnetic threats, for example high current switching, transients on energy networks, radio broadcasting emitters, radio telecommunication networks, radar pulses, electrostatic discharges, lightning discharges, cosmic noise and also electromagnetic pulses from nuclear sources.

It is then necessary to verify electromagnetic compatibility (EMC) during design steps and steps to validate and integrate systems comprising this electromagnetic equipment, to be sure that the various electronic equipment designed to operate close to other equipment will function correctly. Therefore, the EMC verification is designed to guarantee correct operation of electronic equipment in the presence of many others and in an often hostile electromagnetic environment.

Therefore, such a verification requires that a number of EMC tests adapted to each step of the development process should be carried out.

These tests can be classified in four categories:
conducted emission tests,
conducted susceptibility tests,
radiated emission tests, and
radiated susceptibility tests.

Emission tests verify that the electronic equipment does not emit any parasites beyond a given limit considered to be acceptable; susceptibility tests verify that the electronic equipment is sufficiently immunised regarding parasites.

Computer type electronic equipment comprises several electronic boards each comprising several electronic components that will communicate with each other.

During susceptibility tests, checks are made to see whether or not the various electronic components dialogue with each other correctly in the presence of an electromagnetic field.

It is known that so-called Strip-line antennas can be used for performing radiated susceptibility tests, to create a magnetic field to illuminate electronic boards.

A Strip-line antenna forms a containment within which a given relatively uniform electromagnetic field can be created. Electronic boards are located inside this containment and are therefore exposed to the given electromagnetic field. The behaviour of electromagnetic boards is then verified during this exposure.

The known type of Strip-line antenna, of which an example is shown in FIG. 1, comprises two metal plates 102, 104 parallel to each other and facing each other, each of the two triangular shaped longitudinal ends 102.1, 102.2, 104.1, 104.2, each triangular end 102.1, 102.2, 104.1, 104.2 of a plate 102, 104 being inclined towards the triangular end of the other plate 104, 102 located on the same side. Thus, seen from the front, the antenna is in the shape of a hexagon with two longest parallel sides formed by the parallel plates 102, 104, the other two pairs of shorter sides being parallel in pairs and being formed by the triangular ends 102.1, 102.2, 104.1, 104.2.

The plates 102, 104 are separated by a given distance fixed by means of insulating spacers 106 with height h.

The different parts forming the antenna are fixed with respect to each other in a fixed configuration.

A radio frequency power amplifier is output into one longitudinal end, and the second end is loaded on a power resistance with an impedance of 50 ohms.

The field formed inside this antenna is vertically polarised. The value of the field in volts per meter (V/m) depends on the height h and is given by the following relation:

$$|E| = \frac{\sqrt{PZ}}{h} \quad (I)$$

P is the injected power in Watts,
Z is the antenna impedance, and
h is the distance separating the upper plates 102, 104.

The field is uniform within the space located between the plates 102, 104 up to the cutoff frequency $f_{c10}$, at which the antenna operates in multiple resonance and no longer in single resonance.

This cutoff frequency is given by the following relation:

$$f_{c10} = \frac{c}{\lambda_{c10}} = \frac{c}{2L} \quad (II)$$

where c is the speed, and
L is the antenna width, i.e. the width of the parallel plates 102, 104.

The field is thus kept uniform up to this cutoff frequency; the strip-line can be used beyond this cutoff frequency, but the uniformity of the field in the test zone should be checked using a probe and a wattmeter to make sure that the value of the field is equal to or greater than the required specification at all points.

The advantage of this type of antenna is that it can create a strong field over a wide range of frequencies. The fact that it is wide band limits the number of antennas to be purchased and reduces the installation time. The tests are thus done more quickly than if narrow pass band antennas were used.

However, the size of Strip-line antennas according to the state-of-the-art is fixed. Therefore, the available power of the amplifier is not used optimally when the antenna used is oversized relative to the electronic boards to be tested. Furthermore, the value of the electromagnetic field obtained inside the antenna is limited.

Therefore, with this type of antenna, the power of the amplifier must be increased to compensate for the space between the plates. Relation (I) shows that the electromagnetic field is proportional to the square root of the power. Therefore, a large increase in the power is necessary to create a significant increase in the field.

The cost price of High Frequency amplifiers is also high, and an increase in their power significantly increases their cost.

Furthermore, when this type of Strip-line antenna operates above its fixed cutoff frequency, it has non-displaceable resonance modes.

Consequently, one purpose of this invention is to provide an antenna that can be used to perform optimised radiated susceptibility tests for the different electronic boards at a lower cost price.

Another purpose of this invention is to provide an antenna that can be used to perform radiated susceptibility tests beyond the cutoff frequency of displaceable resonance modes.

PRESENTATION OF THE INVENTION

The purpose stated above is achieved using a strip-line type antenna with variable dimensions, particularly capable of providing a variable space between the two variable parallel plates such that the power of the amplifier can be used optimally. This avoids the need to use higher power amplifiers.

Having seen relation (I), the magnetic field is inversely proportional to the distance separating the parallel plates. Thus, for a variable height antenna it is easy to make optimum use of the maximum power that can be output by the amplifier.

The antenna length may also be variable, in other words the parallel plates can be extendable in the longitudinal direction. Thus, resonance modes may be displaced in the case in which the antenna is used beyond this cutoff frequency.

The subject-matter of the present invention is mainly an antenna for electromagnetic compatibility tests comprising an upper plate and a lower plate with parallel longitudinal axes, maintained at a distance from each other and connected mechanically at each of their longitudinal ends by longitudinal plates, said upper and lower plates and said longitudinal plates delimiting a space, characterised in that the upper and lower plates and the longitudinal plates are mounted free to move with respect to each other to delimit a space with dimensions that can be modified.

Advantageously, the upper plate and the lower plate are kept at a predetermined distance by means of variable height spacers. The spacers can then be of the telescopic type.

For example, the longitudinal plates are installed free to move using first pivot links on the longitudinal ends of the upper plate such that the distance separating the upper and lower plates can be modified. This optimises use of the maximum power that the amplifier can output.

For example, the first pivot links may be made of an electrically conducting material to maintain conductivity between the upper plate and the longitudinal plates and between the lower plate and the longitudinal plates.

Advantageously, the antenna according to this invention could comprise at least one upper plate with a variable longitudinal dimension, or the longitudinal dimensions of the upper and the lower plates may each be variable. With this invention, the resonance modes when the antenna is operating beyond its cutoff frequency may be modified.

For example, the variable size longitudinal plates may be of the telescopic type, comprising a male part and a female part, the male and the female parts being permanently in electrical contact.

It may be arranged such that the male part of the upper plate is facing the male part of the lower plate, to distribute the antenna mass uniformly.

Particularly advantageously, conducting spring joints may be provided between the male part and the female part to make a simple and reliable permanent electrical contact between the male part and the female part.

The upper and lower plates may for example be rectangular in shape, to enable continuity in the shape of the upper and lower plates when they are extended longitudinally.

In one variant embodiment, there are four longitudinal plates and they are triangular in shape, two plates being connected through one side to the longitudinal end sides of the upper plate and two plates being connected through one side to the longitudinal ends of the lower plate, the longitudinal plates extending along the sides facing the lower and upper plates being connected at a summit.

For example, the pairs of longitudinal plates connected at a summit are connected by means of a connection element connected to each of said longitudinal plates through a second hinge, said connection element electrically isolating the longitudinal plates that they connect and being electrically connected to the lower plate and to the upper plate.

Advantageously, the antenna comprises means of supporting the longitudinal ends of the antenna, said support means being of variable height. The support means increase the stiffness of the antenna, and thus keep the configuration of the antenna symmetric about a plane passing through the two longitudinal ends of the antenna and parallel to the upper and lower plates.

In another variant embodiment, the lower plate may be a ground plane.

There may be two triangular longitudinal plates, each plate being connected through one side to the longitudinal end sides of the upper plate and connecting at a summit to the lower plate.

BRIEF DESCRIPTION OF THE DRAWINGS

This invention will be better understood after reading the following description and the appended drawings, in which.

DETAILED PRESENTATION OF PARTICULAR EMBODIMENTS

Figure 1:
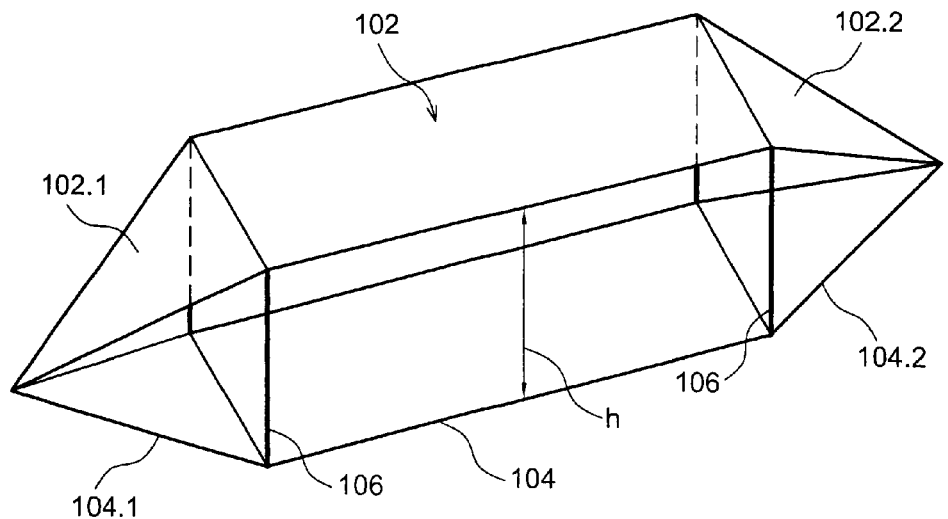
FIG. 1 is a perspective view of a Strip-line antenna according to the state-of-the-art.
Figure 2:
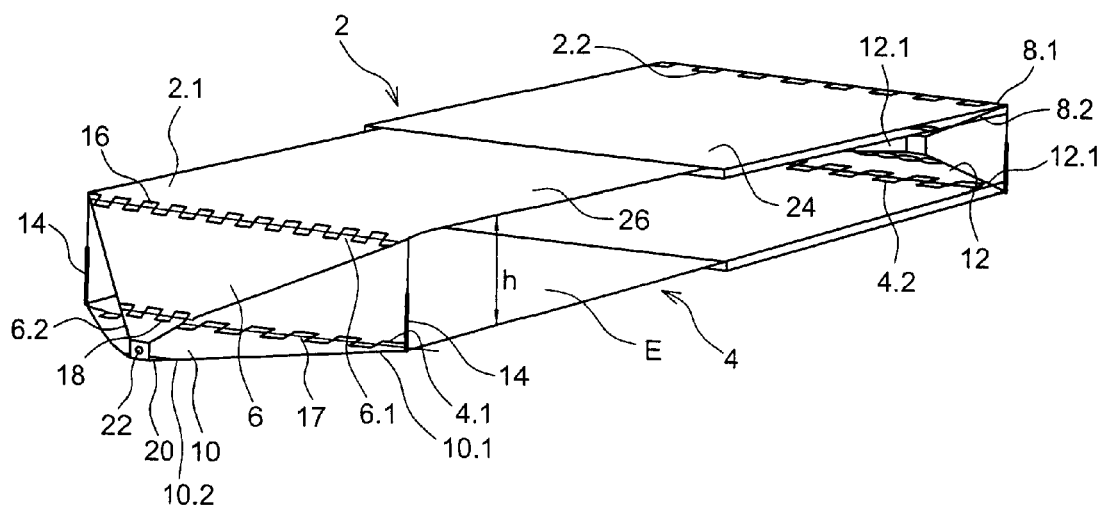
FIG. 2 is a perspective view of a preferred example embodiment of a Strip-line antenna according to this invention.

FIG. 2 shows a preferred example embodiment of a Strip-line antenna according to this invention comprising an upper plate 2 and a lower plate 4 arranged parallel to and facing each other. These plates 2 and 4 are rectangular in shape in the example shown. Each lower plate 2 and upper plate 4 comprises a longitudinal plate 6, 8, 10, 12 respectively, at each of its longitudinal ends. The longitudinal plates 6, 8, 10, 12 in the example are triangular in shape and are connected through one side 6.1, 8.1, 10.1, 12.1 to one side 2.1, 2.2, 4.1, 4.2 of the upper and lower plates 2, 4 respectively.

The longitudinal plates 6, 10 of each upper plate 2 and lower plate 4 arranged on the same side connect at a corner 6.2, 10.2 opposite to the side 6.1, 10.1 connected to the upper plate 2 and lower plate 4 respectively.

The longitudinal plates 8, 12 of each upper plate 2 and lower plate 4, arranged on the same side connect at a summit 8.2, 12.2, opposite to the side 8.1, 12.1 connected to the upper plate 2 and lower plate 4 respectively.

Thus, in a front view, the antenna is hexagonal in shape and comprises two parallel longer sides and four shorter sides parallel in pairs.

A radio frequency power amplifier outputs into one longitudinal end, and the second end is loaded onto a power resistance, for example with 50 ohms impedance.

The upper plate 2 and lower plate 4 and the longitudinal plates 6, 8, 10, 12 delimit an internal space E.

According to this invention, the dimensions of the internal space are variable to optimise the antenna for the electronic boards to be tested.

With this invention the distance h separating the upper plate 2 and the lower plate 4 can be modified.

To achieve this, the longitudinal plates 6, 8, 10, 12 are installed free to move relative to the upper plate 2 and the lower plate 4.

The structure is made mobile so that the height of the antenna can be adjusted. This mobility avoids deforming the parts connected to the amplifier and the 50 Ohm resistance.

We will describe the longitudinal plates 6, in detail, and the description of the plates 8, 12 is similar.

In the example shown, a pivot link 16, for example using a piano type hinge, is provided between the longitudinal plate 6 and the upper plate 2 along the sides 2.1 and 6.1.

Thus, the longitudinal plate 6 is free to move in rotation relative to the upper plate about an X axis along side 2.1 of the upper plate 2.

The longitudinal plate 10 is installed free to move in rotation on the lower plate 4 at one side 4.1 along an X' axis using a first pivot link 17, the X' axis being parallel to the X axis. For example, the pivot link 17 may be a hinge identical to the hinge 16.

The longitudinal plates 6, 10 are also connected at a summit 6.2, 10.2, also free to move.

Two second pivot links 18, 20 connecting the longitudinal plates 6, 10 to a connection element 22 are also provided. These pivot links are parallel to the first pivot links 16, 17.

For example, the pivot links 18, 20 may be hinges 18, 20 of the same type as hinges 16, 17.

Thus, the distance h between the upper plate 2 and the lower plate 4 can be modified.

Consequently, a reduction in h can increase the electromagnetic field by applying the relation (I).

The electromagnetic field can be doubled by halving the height h, while the power output by the amplifier would have to be multiplied by four.

Therefore, the global cost of an "amplifier and Strip-line antenna according to this invention" assembly is very much lower than a "standard amplifier and Strip-line antenna" assembly. The antenna according to this invention can optimise the available power and can be tuned to match the dimensions of the electronic boards as closely as possible.

The hinges 16, 17, 18, 20 are made of a conducting material to assure good electric conductivity between the different parts of the antenna.

It would be possible to use add-on wire conductors overlapping the hinges that are uniformly distributed across the width of the antenna.

The connection element 22 comprises an insulating block, for example made of Teflon, mechanically connecting the plates 6 and 10 and isolating them electrically, and an N type connector with its core connected to the upper plate 2 and the body is connected to the lower plate 4.

Figure 5:
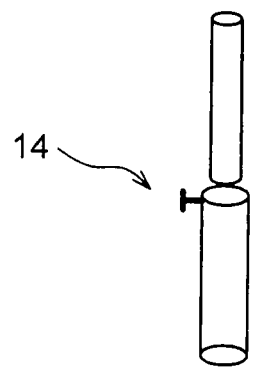
FIG. 5 is a view of an isolated element of the antenna in FIG. 2.
Figure 6:
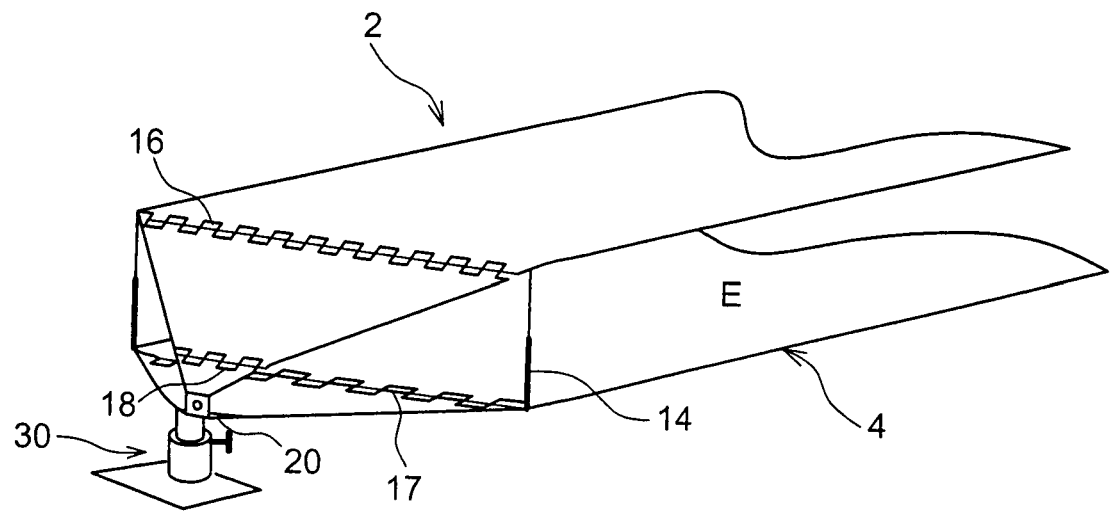
FIG. 6 is a perspective of a variant of a Strip-line antenna shown in FIG. 2.

Furthermore, in the case in which the antenna comprises spacers 14, the spacers are designed such that they are variable in height, as shown in FIG. 5. For example, they may be telescopic. For example, these spacers may be made of an electrically insulating plastic material.

In the example shown, the spacers 14 are arranged at four corners facing the upper plate 2 and the lower plate 4.

The spacers may be adjusted manually using a screw. Other means could be used, for example rack type means. The variation in the height of the spacers can also be controlled by electric motors.

In the preferred example embodiment, it is advantageously arranged such that the upper plate 2 and the lower plate 4 have a variable length l, so that a Strip-line antenna can be made in which resonance modes can be displaced when the antenna is used beyond the cutoff frequency.

We will describe the upper plate 2 in detail, the structure of the lower plate 4 being similar.

The upper plate 2 in the example shown is telescopic. It comprises a female part 24 and a male part 26, the male part penetrating into the female part 24 and being capable of sliding in the female part 24 to modify the length l of the upper plate 2. The male part 26 and the female part 26 are also kept in electrical contact.

Thus, the length of the upper plate can be modified with a ratio of about 2.

There is a clearance j between the male part and the female part to make sliding easy.

Figure 3:
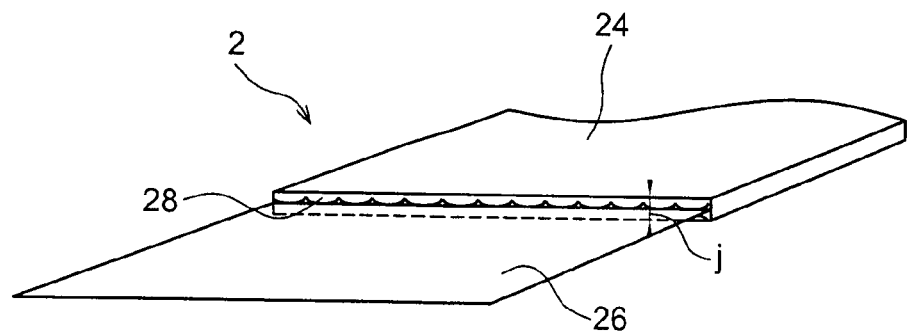
FIG. 3 is a detailed view of the antenna in FIG. 2.
Figure 4:
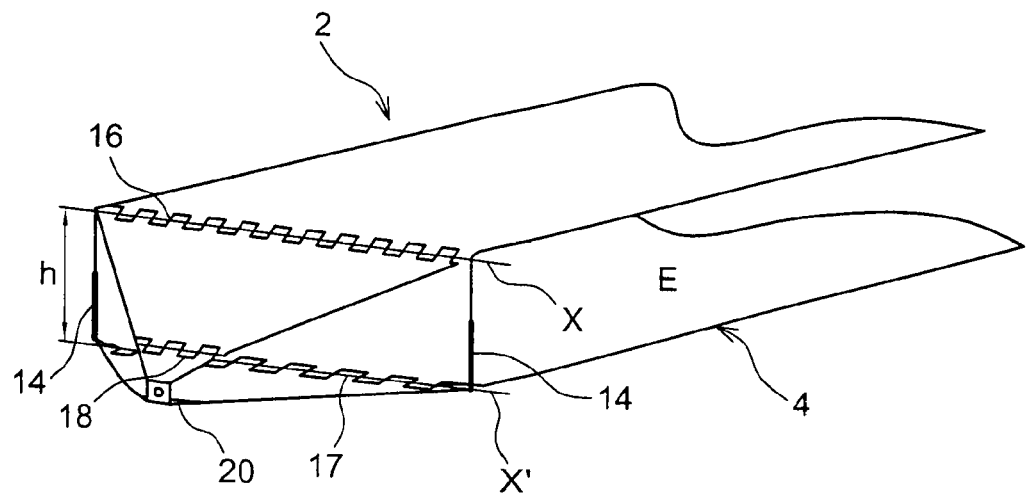
FIG. 4 is a view of another detail of the antenna in FIG. 2.

It is particularly advantageous to prevent the clearance j from creating breaks in electrical conduction, and it is arranged that spring joints 28 made of an electrically conducting material should be provided between the male part 26 and the female part 24, as shown in FIG. 3, to achieve a permanent electrical contact between the female part 24 and the male part, while enabling easy sliding. Therefore, the upper plate 2 is electrically a single piece.

Means are provided for immobilising parts 24 and 26 with respect to each other, for example screw type means.

The conducting joint may be sufficiently rigid to keep the two parts 24, 26 in a fixed position relative to each other.

With Strip-line antennas according to the state of the art, the different parts are fixed to each other rigidly and the antenna naturally keeps its hexagonal shape.

With this invention, since the different parts are free to move relative to each other, it may be advantageous to provide means of supporting the ends of the antenna formed by connection elements 22, to increase the stiffness of the antenna.

In the example shown, these support means are composed of adjustable height telescopic stands 30 in which the height is adjusted as a function of the change in the dimensions of the internal space in the antenna. Thus, the antenna maintains a determined shape. For example, the stands 28 may be of the same type as the telescopic spacers 14.

It would be possible for friction between the different mobile parts to be sufficiently high to keep the antenna in a determined position.

Figure 7:
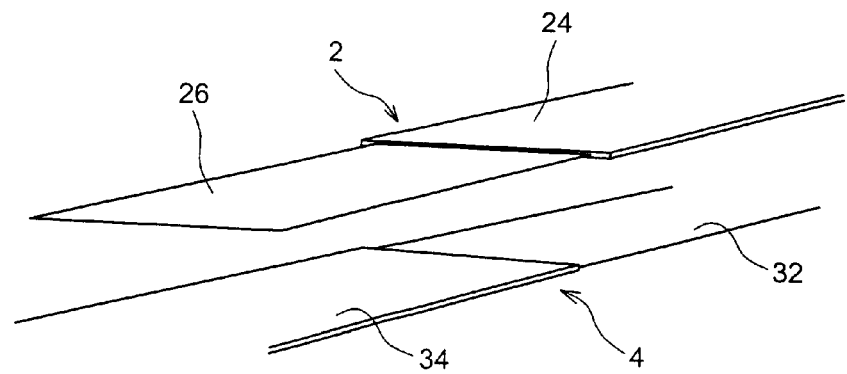
FIG. 7 is a perspective view of another variant embodiment of the antenna in FIG. 2.

FIG. 7 shows a variant of the antenna in FIG. 2, in which the male part 24 of the upper plate 2 and the male part 32 of the lower plate 4 are staggered from each other, which has the advantage of distributing the mass of the antenna uniformly over the entire structure. The mass of the female parts 24, 34 is usually greater than the mass of the male parts.

FIG. 2 shows an example embodiment of an antenna in which the male parts are one above the other.

The male and female parts may be made from the same material.

Obviously, it would be possible to have an antenna that does not contain variable length upper and lower plates 2 and 4. In this case, only the end plates would be mobile so that the height of the antenna can be modified.

Obviously, it would be possible to have an antenna in which only the upper and lower plates are variable in length, without going outside the scope of this invention.

Figure 8:
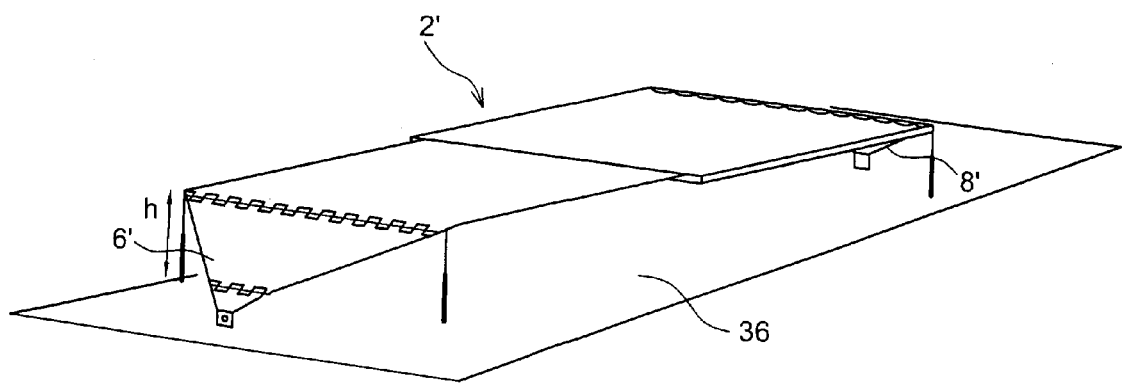
FIG. 8 is a perspective view of another example embodiment of an antenna according to this invention.

In another example embodiment shown in FIG. 8, the Strip-line antenna according to this invention comprises an upper plate 2' and longitudinal plates 6' and 8' connected to the longitudinal ends of the upper plate 2', this assembly being supported on a ground plane 36.

The assembly composed of the upper plate 2' and the longitudinal plates 6' and 8' is hinged in a manner similar to that described above, to make a Strip-line antenna with variable dimensions.

In this example, the width of the upper plate 2' is variable and the side plates are installed free to move on the upper plate 2', but it would be possible for the antenna to comprise a single variable length upper plate 2', or only mobile side plates on the upper plate 2'.

For example, the different parts of the antenna may be made of copper, brass or aluminium.

An antenna comprising upper and lower plates and longitudinal plates with shapes different from those described would also be within the scope of this invention.

The invention claimed is:

1. An antenna to perform electromagnetic compatibility tests, comprising:
    an upper plate; a lower plate, longitudinal axes of the upper plate and the lower plate remaining parallel, a distance between the upper plate and the lower plate being maintained to delimit a space therebetween; and longitudinal plates connected mechanically to the upper plate and the lower plate at each of their longitudinal ends,
    wherein the upper plate and lower plate and the longitudinal plates are movable with respect to each other to modify at least one dimension of the space by changing the distance between the upper plate and the lower plate, and
    at least one of the upper and lower plate has a variable longitudinal dimension.

2. The antenna according to claim 1, wherein the distance between the upper plate and the lower plate is kept at a predetermined distance by variable height spacers.

3. The antenna according to claim 2, wherein the variable height spacers are telescopic.

4. The antenna according to claim 1, wherein the longitudinal plates are movably installed using a first pivot on the longitudinal ends of the upper plate.

5. The antenna according to claim 4, wherein the first pivot is made of an electrically conducting material.

6. The antenna according to claim 1, wherein the upper plate is telescopic and includes a male part and a female part, the male part and the female part being permanently in electrical contact.

7. The antenna according to claim 1, wherein the upper plate and the lower plate each have a variable longitudinal dimension.

8. The antenna according to claim 7, wherein the upper plate and the lower plate are telescopic, each of the upper plate and lower plate comprising a male part and a female part, the male part and the female part being permanently in electrical contact.

9. The antenna according to claim 8, wherein the male part of the upper plate is above the female part of the lower plate, and the female part of the upper plate is above the male part of the lower plate.

10. The antenna according to claim 6, further comprising conducting spring joints located between the male part and the female part of each of the upper and lower plates to make a permanent electrical contact between the male part and the female part.

11. The antenna according to claim 1, wherein at least one of the upper plate the lower plate is rectangular in shape.

12. The antenna according to claim 11, comprising:
    four longitudinal plates being triangular in shape, two plates of the four longitudinal plates being connected through one side to the longitudinal end sides of the upper plate and two plates of the four longitudinal plates being connected through one side to the longitudinal ends of the lower plate, the four longitudinal plates extending along sides facing the lower and upper plates being connected at a summit.

13. The antenna according to claim 12, wherein pairs of the four longitudinal plates connected at a summit are connected by a connection element connected to each of the four longitudinal plates through a pivot link, the connection element electrically isolating the four longitudinal plates and being electrically connected to the lower plate and to the upper plate.

14. The antenna according to claim 12, further comprising a support system to support the longitudinal ends of the antenna, the support system being of variable height.

15. The antenna according to claim 1, wherein the lower plate is a ground plane.

16. The antenna according to claim 15, comprising two triangular longitudinal plates, each triangular longitudinal plate being connected through one side to the longitudinal end sides of the upper plate and being connected at a summit to the lower plate.

* * * * *